United States Patent
Song et al.

(10) Patent No.: US 10,125,947 B2
(45) Date of Patent: Nov. 13, 2018

(54) BOARD AND LIGHT SOURCE MODULE INCLUDING THE SAME

(71) Applicant: SAMSUNG ELECTRONICS CO., LTD., Suwon-si (KR)

(72) Inventors: Jin Kwan Song, Suwon-si (KR); Hyo Yeon Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 294 days.

(21) Appl. No.: 15/097,065

(22) Filed: Apr. 12, 2016

(65) Prior Publication Data

US 2017/0059141 A1     Mar. 2, 2017

(30) Foreign Application Priority Data

Aug. 27, 2015  (KR) .................. 10-2015-0120700

(51) Int. Cl.
| | |
|---|---|
| F21V 7/00 | (2006.01) |
| F21S 41/00 | (2018.01) |
| H05K 1/02 | (2006.01) |
| F21V 29/70 | (2015.01) |
| F21S 43/19 | (2018.01) |
| F21S 43/14 | (2018.01) |
| F21S 45/47 | (2018.01) |
| F21V 15/01 | (2006.01) |

(Continued)

(52) U.S. Cl.
CPC ............ *F21V 7/0083* (2013.01); *F21S 41/00* (2018.01); *F21S 43/14* (2018.01); *F21S 43/19* (2018.01); *F21S 43/195* (2018.01); *F21S 45/47* (2018.01); *F21V 29/70* (2015.01); *H05K 1/028* (2013.01); *F21V 15/01* (2013.01); *F21Y 2107/70* (2016.08); *F21Y 2115/10* (2016.08); *H05K 2201/09036* (2013.01); *H05K 2201/09063* (2013.01); *H05K 2201/10106* (2013.01)

(58) Field of Classification Search
CPC ........ F21V 7/0083; F21V 29/70; F21V 15/01; F21S 43/14; F21S 43/19; F21S 43/195; F21S 41/00; F21S 45/47; F21Y 2115/10; F21Y 2107/70; H05K 1/028; H05K 2201/09036; H05K 2201/09063; H05K 2201/10106
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |

(Continued)

FOREIGN PATENT DOCUMENTS

| | | |
|---|---|---|
| JP | 11-191662 A | 7/1999 |
| JP | 2007-165707 A | 6/2007 |

(Continued)

*Primary Examiner* — Mary Ellen Bowman
(74) *Attorney, Agent, or Firm* — Sughrue Mion, PLLC

(57) ABSTRACT

Provided is a board. The board may include: a plurality of body portions; and a connecting portion disposed between the plurality of body portions to integrally connect the plurality of body portions, wherein a shape of the connecting portion is changed between a flat shape and a protruding shape, when positions of the plurality of body portions are changed by rotating the plurality of body portions based on the connecting portion.

19 Claims, 15 Drawing Sheets

(51) Int. Cl.
*F21Y 115/10* (2016.01)
*F21Y 107/70* (2016.01)

(56) References Cited

U.S. PATENT DOCUMENTS

| | | | |
|---|---|---|---|
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 * | 8/2006 | Okuyama | H01L 33/007 257/103 |
| 7,154,124 B2 | 12/2006 | Han et al. | |
| 7,208,725 B2 * | 4/2007 | Sherrer | G02B 6/4204 250/216 |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,058,560 B2 * | 11/2011 | Lo | H05K 1/028 174/117 F |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,530,747 B2 | 9/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 2002/0050399 A1 * | 5/2002 | Yang | H05K 1/028 174/250 |
| 2006/0148116 A1 * | 7/2006 | Richard | H05K 1/0278 438/48 |
| 2007/0141864 A1 | 6/2007 | Kataoka | |
| 2008/0259629 A1 * | 10/2008 | Takuwa | B60Q 1/2607 362/548 |
| 2010/0046245 A1 * | 2/2010 | Ansari | F21V 29/30 362/547 |
| 2011/0122643 A1 * | 5/2011 | Spork | F21V 17/164 362/549 |
| 2011/0228536 A1 * | 9/2011 | Im | F21S 41/192 362/249.06 |
| 2012/0061690 A1 * | 3/2012 | Lee | H05K 1/142 257/88 |
| 2012/0182753 A1 * | 7/2012 | Otsubo | F21V 23/06 362/544 |
| 2012/0243212 A1 * | 9/2012 | Smith | H05K 1/028 362/183 |
| 2014/0160783 A1 * | 6/2014 | Lee | F21S 48/321 362/540 |
| 2015/0003083 A1 * | 1/2015 | Uehara | H05K 1/056 362/418 |
| 2015/0029685 A1 | 1/2015 | Lin et al. | |
| 2018/0010775 A1 * | 1/2018 | Sung | F21V 19/0015 |

FOREIGN PATENT DOCUMENTS

| | | |
|---|---|---|
| JP | 2015-29081 A | 2/2015 |
| KR | 2002-0033922 A | 5/2002 |
| KR | 10-0733877 B1 | 7/2007 |
| KR | 10-1110865 B1 | 2/2012 |
| KR | 10-2012-0068321 A | 6/2012 |
| KR | 10-1300577 B1 | 8/2013 |
| KR | 10-1322456 B1 | 10/2013 |
| KR | 10-2014-0029679 A | 3/2014 |
| KR | 10-1397604 B1 | 5/2014 |
| KR | 10-2015-0013005 A | 2/2015 |

\* cited by examiner

BOARD AND LIGHT SOURCE MODULE INCLUDING THE SAME

CROSS-REFERENCE TO RELATED APPLICATION

This application claims the priority and benefit of Korean Patent Application No. 10-2015-0120700, filed on Aug. 27, 2015 in the Korean Intellectual Property Office, the disclosure of which is incorporated herein in its entirety by reference.

BACKGROUND

Methods and apparatuses consistent with exemplary embodiments relate to a board and a light source module including the same.

In general, when lengths of light source modules are increased by a predetermined length or more, lengths of flexible printed circuit boards (FPCBs) used in light source modules for automotive electronics may also be increased. In this case, a surface mounting technology (SMT) process may not be performed a single time due to limitation of sizes, for example, at maximum 500 mm, able to allow for SMT process in SMT equipment. Thus, SMT process should be performed by dividing FPCBs into two parts, and a process of re-connecting the divided parts to each other should be additionally carried out.

Processes of connecting FPCBs may be performed in a scheme in which two divided parts are safely mounted on jigs for hand soldering, respectively, and separate jumper FPCBs are attached to connecting parts to connect the divided parts through manually-performed soldering.

Such hand soldering may cause an occurrence of defects in solders such as short circuits, a lack of lead, and the like, and manufacturing costs and process times may be increased. Furthermore, defect rates may be increased to deteriorate product reliability.

SUMMARY

Exemplary embodiments provide a scheme in which surface mounting technology (SMT) may be performed once without dividing a board into parts even when a length of the board is relatively long.

According to an aspect of an exemplary embodiment, there is provided a board, the board may include: a plurality of body portions, and a connecting portion disposed between the plurality of body portions to integrally connect the plurality of body portions, wherein a shape of the connecting portion is changed between a flat shape and a protruding shape, when positions of the plurality of body portions are changed by rotating the plurality of body portions based on the connecting portion.

The connecting portion may include an inner surface and an outer surface connecting two end surfaces of the plurality of body portions opposing each other, and have an asymmetrical structure in which the inner surface and the outer surface have different lengths.

A length of the inner surface may be shorter than a length of the outer surface.

The inner surface and the outer surface respectively have a curved surface and are curved in the same direction.

The outer surface may include a concave groove concavely recessed toward the inner surface.

The plurality of body portions may include a first position in which the connecting portion is spread to be maintained in a flat plane structure and a second position in which the connecting portion is folded to be maintained in a three-dimensional structure protruded upwardly of flat surfaces of the plurality of body portions.

The plurality of body portions may be disposed to form an angle based on the connecting portion, in the first position.

The connecting portion may have a structure in which the connecting portion is folded in half to allow two sides of the outer surface to approximate each other based on a virtual central line passing through a center of the outer surface and the inner surface, in the second position.

The inner surface may be disposed on the same positional level as a position of the plurality of body portions, and the outer surface may be disposed on a positional level different from a position of the inner surface to be protruded upwardly of surfaces of the plurality of body portions, in the second position.

The connecting portion may include a structure inclined from the outer surface disposed in a higher position toward the inner surface and the plurality of body portions disposed in a lower position, in the second position.

Each of the body portions may include a plurality of mounting regions on which light emitting devices are respectively mounted, and extending regions respectively disposed between the plurality of mounting regions to connect the mounting regions.

According to another aspect of an exemplary embodiment, there is provided a light source module, the light source module may include: a frame comprising a plurality of mounting surfaces arranged at different positional levels; a plurality of heat sinks respectively connected to the plurality of mounting surfaces; and a light source comprising a board respectively disposed on the plurality of heat sinks, and a plurality of light emitting devices respectively mounted on the board respectively disposed on the plurality of mounting surfaces, wherein the board may include a plurality of body portions and a connecting portion disposed between the plurality of body portions to integrally connect the plurality of body portions, and wherein a shape of the connecting portion is changed between a flat shape and a protruding shape, when positions of the plurality of body portions are changed by rotating the plurality of body portions based on the connecting portion.

The frame may further include a plurality of protrusions protruded from the mounting surface, and the board may include a plurality of connection holes into which the plurality of protrusions are inserted.

The plurality of body portions may respectively include a plurality of mounting regions respectively disposed on the plurality of mounting surfaces and on which the light emitting devices are respectively mounted, and extending regions respectively disposed between the plurality of mounting regions to connect the mounting regions.

The frame may include a stepped structure defining the different positional levels of the plurality of mounting surfaces rise in an arrangement direction.

The frame may further include a plurality of connecting surfaces vertically connecting the plurality of mounting surfaces to each other.

Each of the heat sinks may include a base portion respectively disposed on each of the plurality of mounting surfaces, and an extending portion extending from an edge of the base portion to be bent to be substantially perpendicular to the base portion.

According to another aspect of an exemplary embodiment, there is provided a light apparatus, the light apparatus may include: a light source module, a housing supporting the light source module, and a cover covering the housing to cover the light source module, wherein the light source module may include a frame comprising a plurality of mounting surfaces arranged at different levels, a plurality of heat sinks respectively connected to the plurality of mounting surfaces, a board comprising a plurality of body portions and a connecting portion disposed between the plurality of body portions to integrally connect the plurality of body portions and respectively disposed on the plurality of heat sinks, and a plurality of light emitting devices respectively mounted on the board respectively disposed on the plurality of mounting surfaces.

The light apparatus may further include a reflector configured to reflect light of the light source module.

The reflector may include a plurality of reflective surfaces and a plurality of through holes respectively formed on a bottom surface of each of the plurality of reflective surfaces, and the plurality of light emitting devices are respectively exposed to the plurality of reflective surfaces through the through holes.

BRIEF DESCRIPTION OF DRAWINGS

The above and other aspects, features and other advantages of exemplary embodiments will be more clearly understood from the following detailed description taken in conjunction with the accompanying drawings, in which.

DETAILED DESCRIPTION OF THE EXEMPLARY EMBODIMENTS

Figure 1:
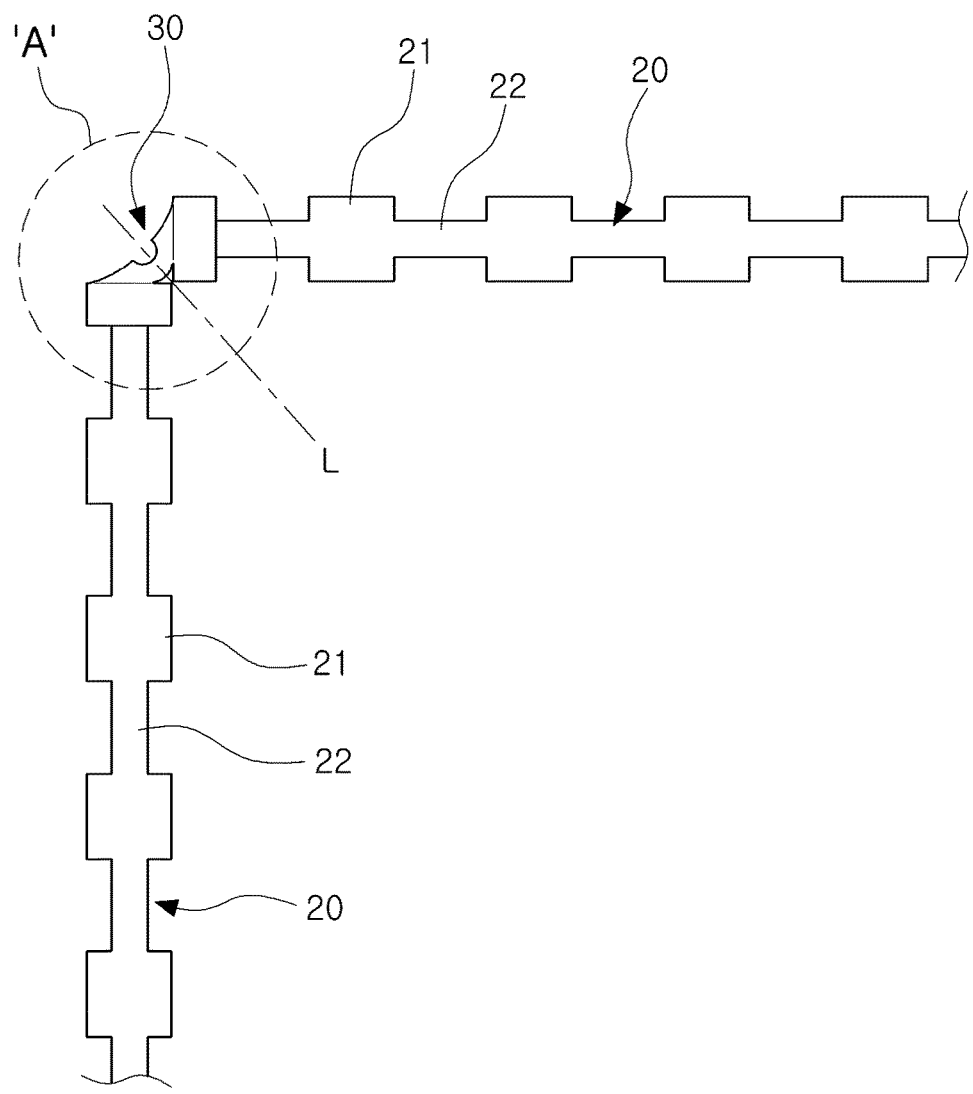
FIG. 1 is a schematic plan view of a board according to an exemplary embodiment, viewed from a first position.

Hereinafter, various exemplary embodiments will be described more fully with reference to the accompanying drawings.

The inventive concept may, however, be exemplified in many different forms and should not be construed as being limited to the specific exemplary embodiments set forth herein. Rather, these exemplary embodiments are provided so that this disclosure will be thorough and complete, and will fully convey the scope of the inventive concept to those skilled in the art.

It will be understood that when an element, such as a layer, region or wafer (substrate), is referred to as being "on," "connected to," or "coupled to" another element, it can be directly "on," "connected to," or "coupled to" the other element or intervening elements may be present. In contrast, when an element is referred to as being "directly on," "directly connected to," or "directly coupled to" another element, there are no intervening elements or layers present. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments will be described with reference to schematic views illustrating exemplary embodiments of the inventive concept. In the drawings, for example, due to manufacturing techniques and/or tolerances, modifications of the shape shown may be estimated. Thus, exemplary embodiments should not be construed as being limited to the particular shapes of regions shown herein, for example, to include a change in shape results in manufacturing. The following exemplary embodiments may also be constituted by one or a combination thereof.

The contents described below may have a variety of configurations and propose only a required configuration herein, but are not limited thereto.

Figure 2A:
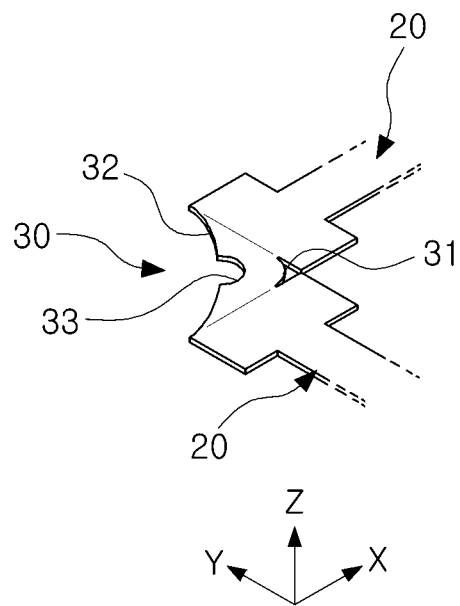
FIGS. 2A and 2B are enlarged perspective views of portion 'A' of the board of FIG. 1.
Figure 2B:
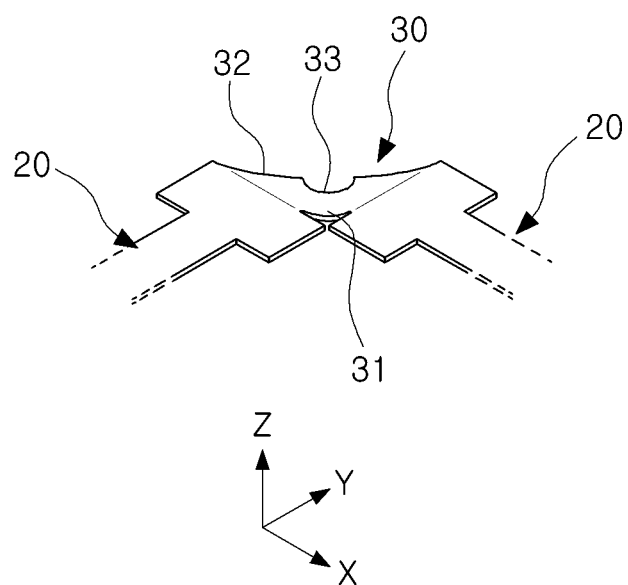
Figure 3:
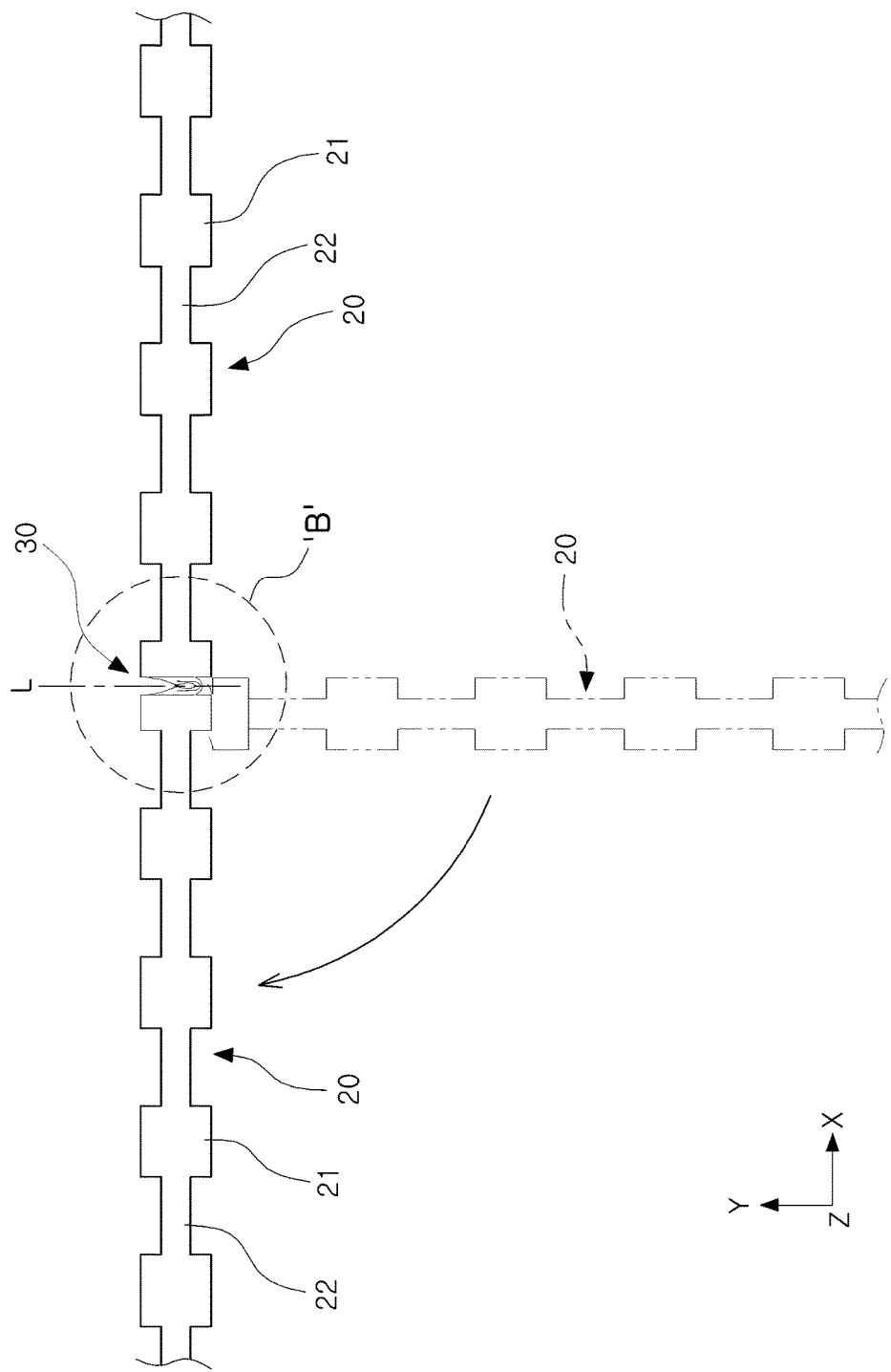
FIG. 3 is a schematic plan view of a board according to an exemplary embodiment, viewed from a second position.
Figure 4A:
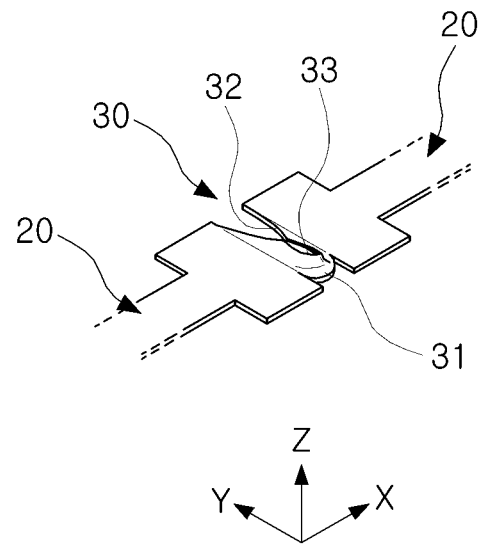
FIGS. 4A and 4B are enlarged perspective views illustrating portion 'B' of the board of FIG. 3.
Figure 4B:
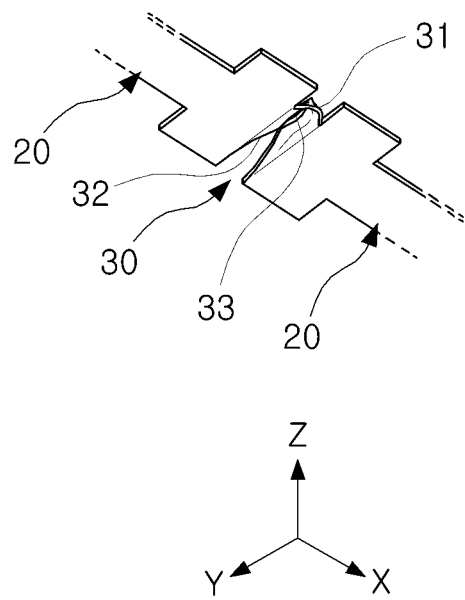

Hereinafter, with reference to FIGS. 1 to 4B, a board according to an exemplary embodiment will be described. FIG. 1 is a schematic plan view of a board according to an exemplary embodiment viewed from a first position. FIGS. 2A and 2B are enlarged perspective views of portion 'A' of the board of FIG. 1. FIG. 3 is a schematic plan view of a board according to an exemplary embodiment viewed from a second position. FIGS. 4A and 4B are enlarged perspective views illustrating portion 'B' of the board of FIG. 3.

Referring to FIGS. 1 to 2B, a board 10 according to an exemplary embodiment may include a plurality of body portions 20 having a flat shape, and a connecting portion 30 connecting the plurality of body portions 20 to each other.

The plurality of body portions 20 may respectively have a flat rectangular band shape, and have structures corresponding to each other.

The plurality of body portions 20 may respectively include a plurality of mounting regions 21 on which a light source is mounted, and extending regions 22 disposed between the plurality of mounting regions 21 to connect the mounting regions 21. The light source may be, for example, a light emitting device.

The plurality of body portions 20 may be, for example, flexible printed circuit boards (FPCBs) freely bendable, of which shapes are variously changeable. Further, the plurality of body portions 20 may have a circuit wiring for an electrical connection.

The connecting portion 30 may be disposed between the plurality of body portions 20 to connect the plurality of body portions 20 to each other.

The connecting portion 30 may have a structure that when the plurality of body portions 20 are rotated based on the connecting portion 30, positions of the plurality of body portions 20 are changed, and a form of the connecting portion 30 may be changed between flat-form structure and protruding-form structure. For example, the plurality of body portions 20 may have a first position and a second position, and the connecting portion 30 may have different forms according to the positions of the body portions 20.

FIGS. 1 to 2B schematically illustrate a state in which the plurality of body portions 20 are disposed in the first position.

As illustrated in FIGS. 1 to 2B, the plurality of body portions 20 may be disposed to form a substantially right angle to each other, based on the connecting portion 30, in the first position. For example, the plurality of body portions 20 may be disposed to have a bent structure, for example, in the form of '⌐' via the connecting portion 30.

The exemplary embodiment illustrates a case in which the plurality of body portions 20 are disposed to form a perpendicularly bent '⌐' structure, but the disposition of the plurality of body portions 20 is not limited thereto. For example, the plurality of body portions 20 may be disposed in a structure of forming an acute angle or an obtuse angle.

The connecting portion 30 may be spread at the first position to be maintained in a linear form and a flat structure to be substantially planar with the plurality of body portions 20. For example, the board 10 may have a two-dimensional structure in which the plurality of body portions and the connecting portion 30 are substantially flat in relation to each other.

The connecting portion 30 may include an inner side surface 31 and an outer side surface 32 connecting two end surfaces of adjacent body portions 20.

The inner side surface 31 and the outer side surface may have an asymmetrical structure in which they have different lengths. For example, a length of the inner side surface 31 may be shorter than that of the outer side surface 32.

The inner side surface 31 and the outer side surface may respectively have a curved surface. The inner side surface 31 and the outer side surface 32 may be curved in the same direction.

The outer side surface 32 may have a concave groove 33 concavely recessed toward the inner side surface 31. The concave groove 33 may be formed in a central portion of the outer side surface 32. The concave groove 33 may be omitted according to an exemplary embodiment.

FIGS. 3 to 4B schematically illustrate a state in which the plurality of body portions 20 are disposed in a second position.

As illustrated in FIGS. 3 to 4B, the plurality of body portions 20 may be disposed to have a substantially linear form such as a '—' shape, in the second position, for example, while forming a straight angle to each other. In other words, the plurality of body portions 20 may have a structure in which they spread in a '—' form through the connecting portion 30.

The connecting portion 30 may be folded at the second position to maintain a three dimensional structure in which the connecting portion 30 is protruded upwardly of flat surfaces of the plurality of body portions 20. For example, the board 10 may have a three dimensional structure in which the connecting portion 30 is partially protruded upwardly of flat surfaces of the plurality of body portions 20.

Figure 5:
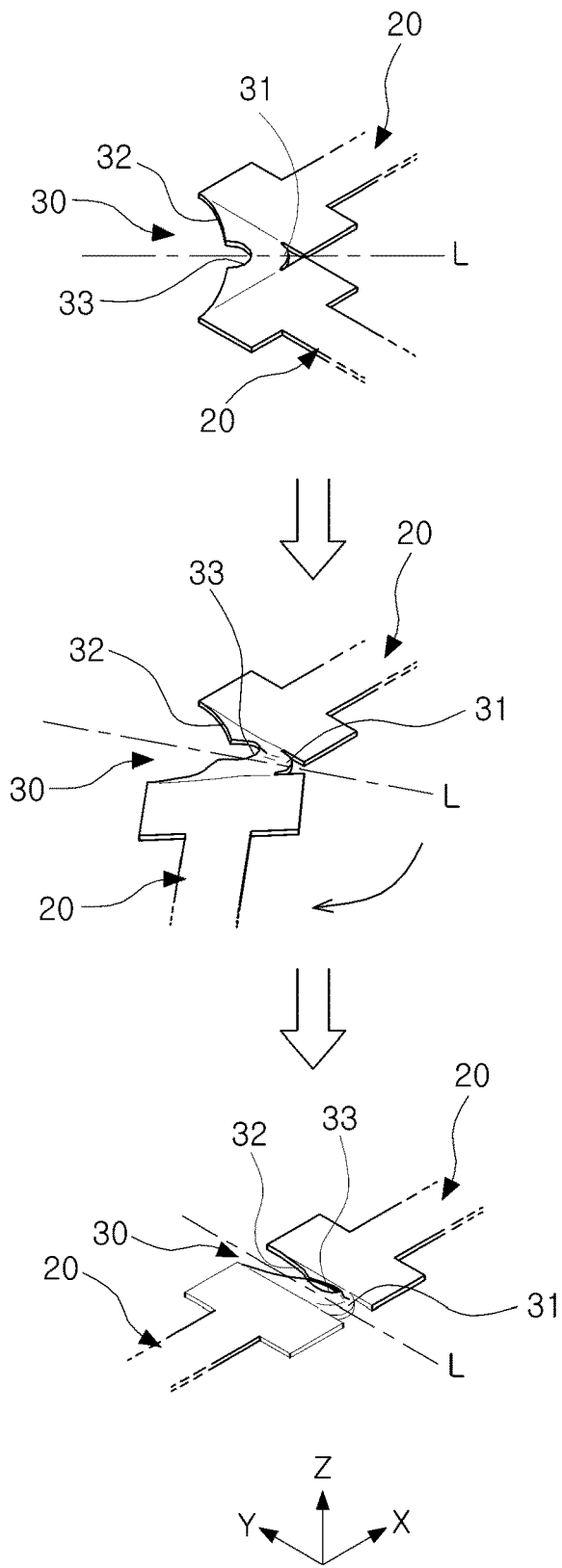
FIG. 5 schematically illustrates a state in which a shape of a connecting portion is changed.

FIG. 5 schematically illustrates a state in which a shape of the connecting portion 30 is changed. Referring to FIG. 5, since the plurality of body portions 20 are spread from a right angle state to a straight angle state, the connecting portion 30 may have a structure in which the connecting portion 30 is folded in half to allow two sides of the outer side surface 32 to approximate each other, based on a virtual central line L passing through a center of the outer side surface 32 and the inner side surface 31. For example, two ends of the outer side surface 32 connected to the body portions 20 may become adjacent in a structure in which they are gathered adjacent to the virtual central line L to oppose each other.

The inner side surface 31 may be disposed on the same positional level as that of the plurality of body portions 20. The outer side surface 32 may be disposed on a positional level different from that of the inner side surface 31 to be protruded upwardly of surfaces of the plurality of body portions 20. For example, the outer side surface 32 may be located in a position higher than that of the inner side surface 31.

The connecting portion 30 may have a structure inclined from the outer side surface 32 disposed in a relatively high position toward the inner side surface 31 and the plurality of body portions 20 disposed in relatively low positions.

Figure 6A:
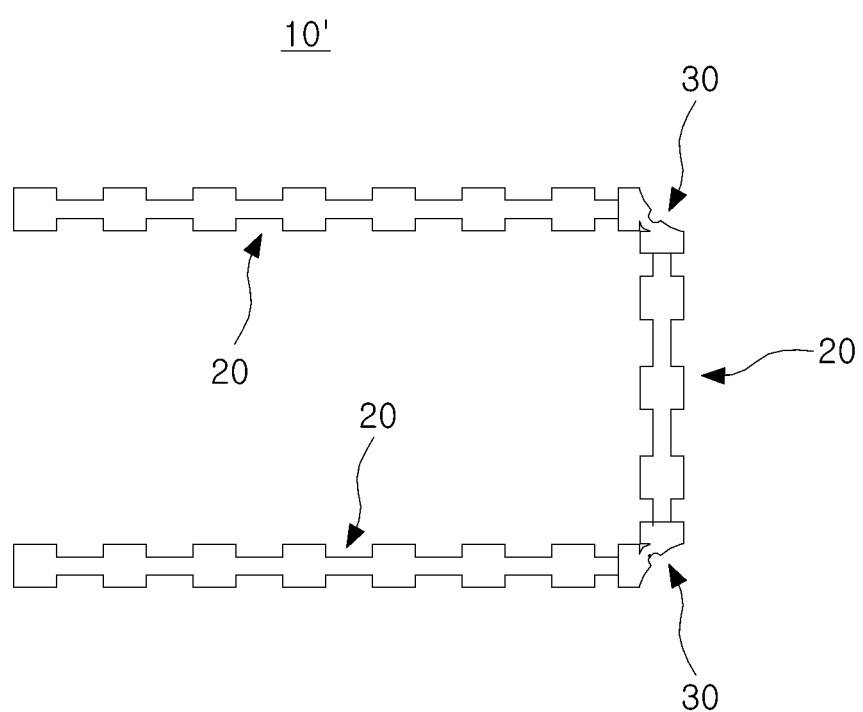
FIGS. 6A and 6B are plan views schematically illustrating a modified example of a board.
Figure 6B:
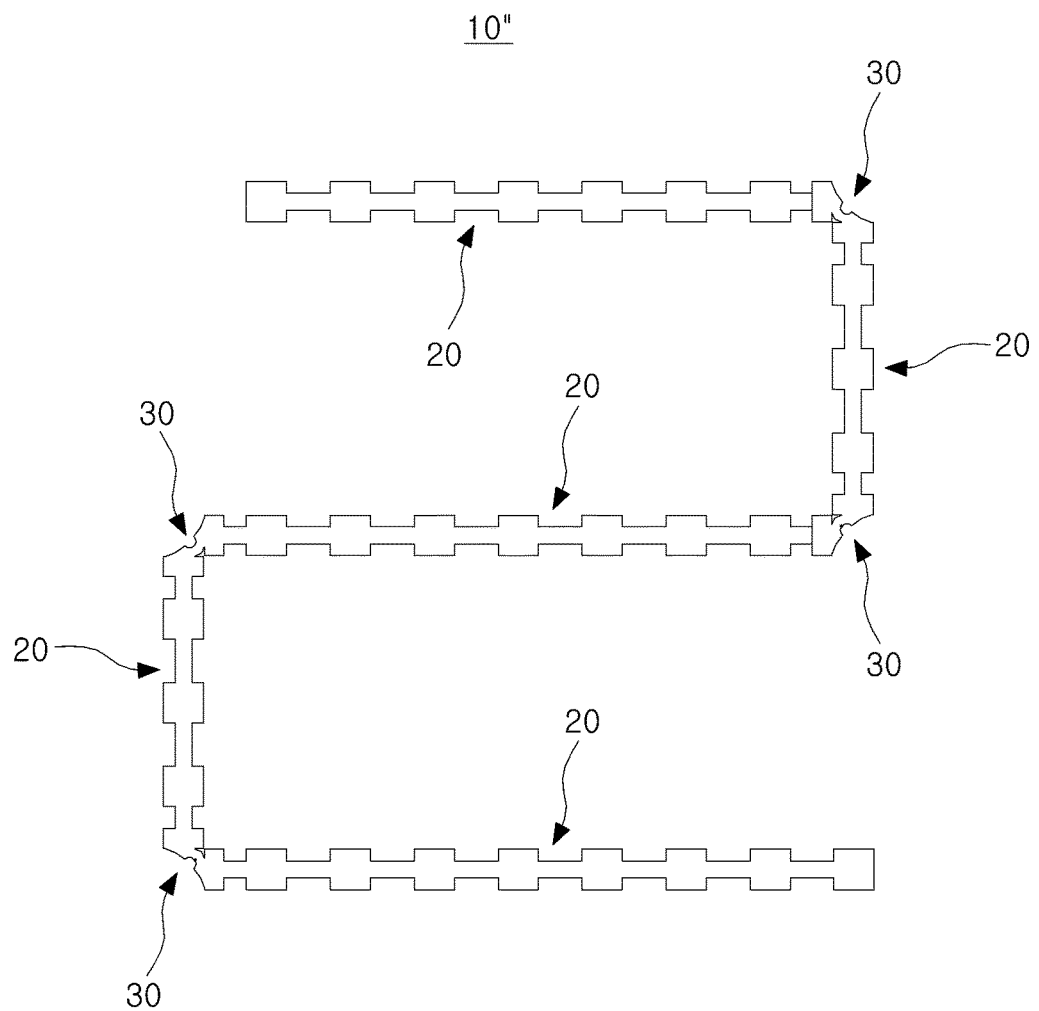

FIGS. 6A and 6B schematically illustrate a modified example of the board. FIGS. 6A and 6B are plan views schematically illustrating modified examples of the board.

A board 10' according to an exemplary embodiment illustrated in FIG. 6A may be understood as being configured equally to the configuration in the foregoing exemplary embodiment, except for a configuration in which the body portions 20 are provided as three and the three body portions are disposed to have a 'ㄷ' shape in a first position.

In addition, a board 10" according to an exemplary embodiment illustrated in FIG. 6B may be understood as having the same configuration as the foregoing exemplary embodiment, except for a configuration in which the body portions 20 are provided as five and the five body portions are disposed to have a 'ㄹ' shape in the first position.

As such, according to the exemplary embodiment, even in a case in which a length of the board 10 is relatively long, the board 10 may have a bent form such as a 'ㄱ', 'ㄷ', or 'ㄹ' shape, or the like, instead of dividing the board into a plurality of parts as in the related art. Thus, SMT may be implemented once in SMT equipment. By allowing such a bent form of board to be spread to have a linear form such as '—' shape, a board having a length longer than a size of SMT equipment may be implemented.

For example, since the connecting portion 30 serving as a bent portion of the board 10 has an asymmetrical curved surface structure, the connecting portion 30 may be folded while being protruded upwardly of the board 10 when the board 10 is spread, thereby preventing the board 10 from being torn or cut.

Thus, inconvenience and problems in the related art in that since SMT may not be performed a single time in a case in which a length of a board is longer than a size of SMT equipment able to implement SMT, the board should be divided into a plurality of parts in order to conduct SMT and an additional hand soldering process of re-connecting the divided parts of the board to each other should be additionally performed may be solved.

Figure 7:
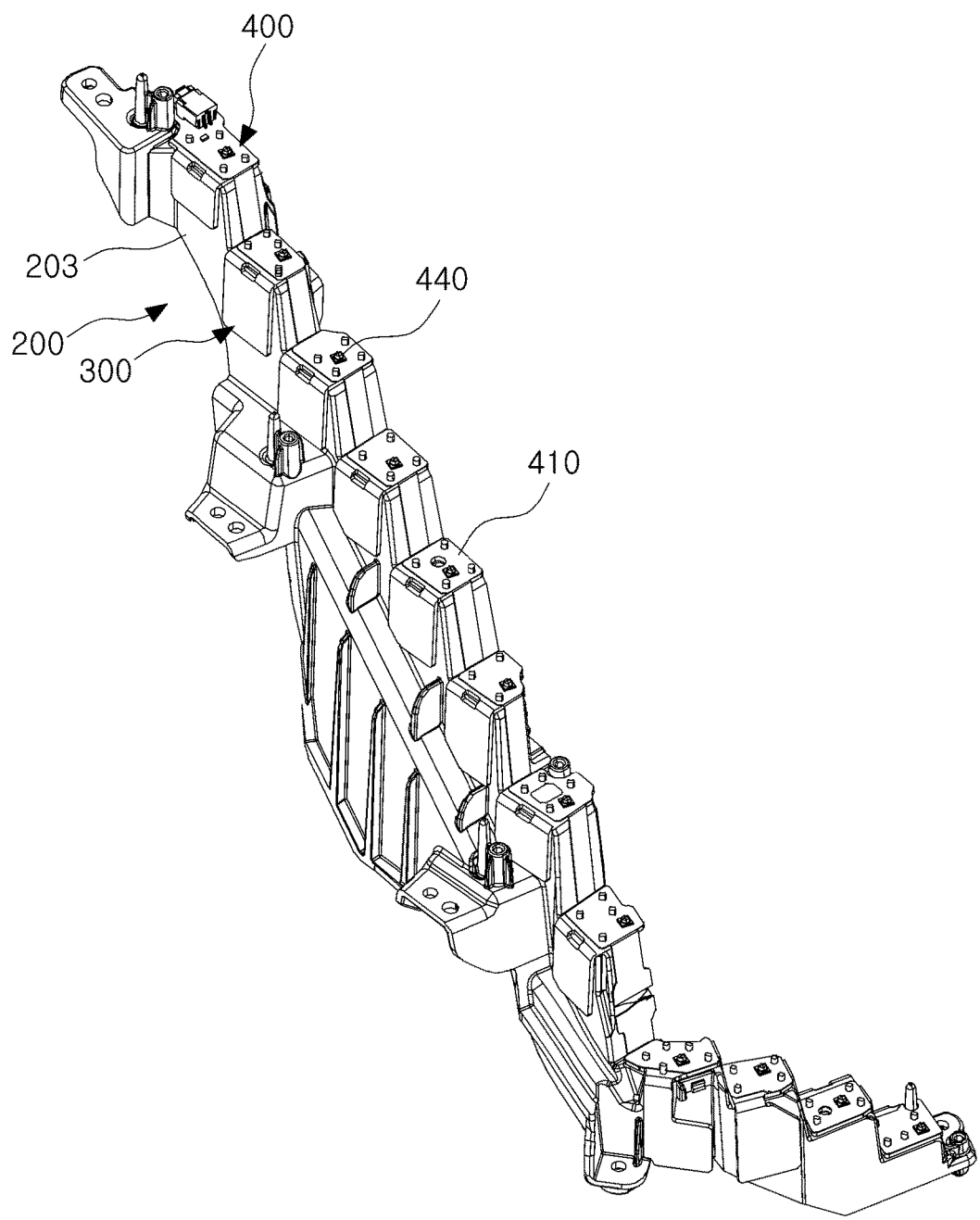
FIG. 7 is a perspective view schematically illustrating a light source module according to an exemplary embodiment.

A light source module according to an exemplary embodiment will be described with reference to FIGS. 7 and 8. FIG. 7 is a perspective view schematically illustrating a light source module according to an exemplary embodiment, and FIG. 8 is an exploded perspective view of FIG. 7.

Figure 8:
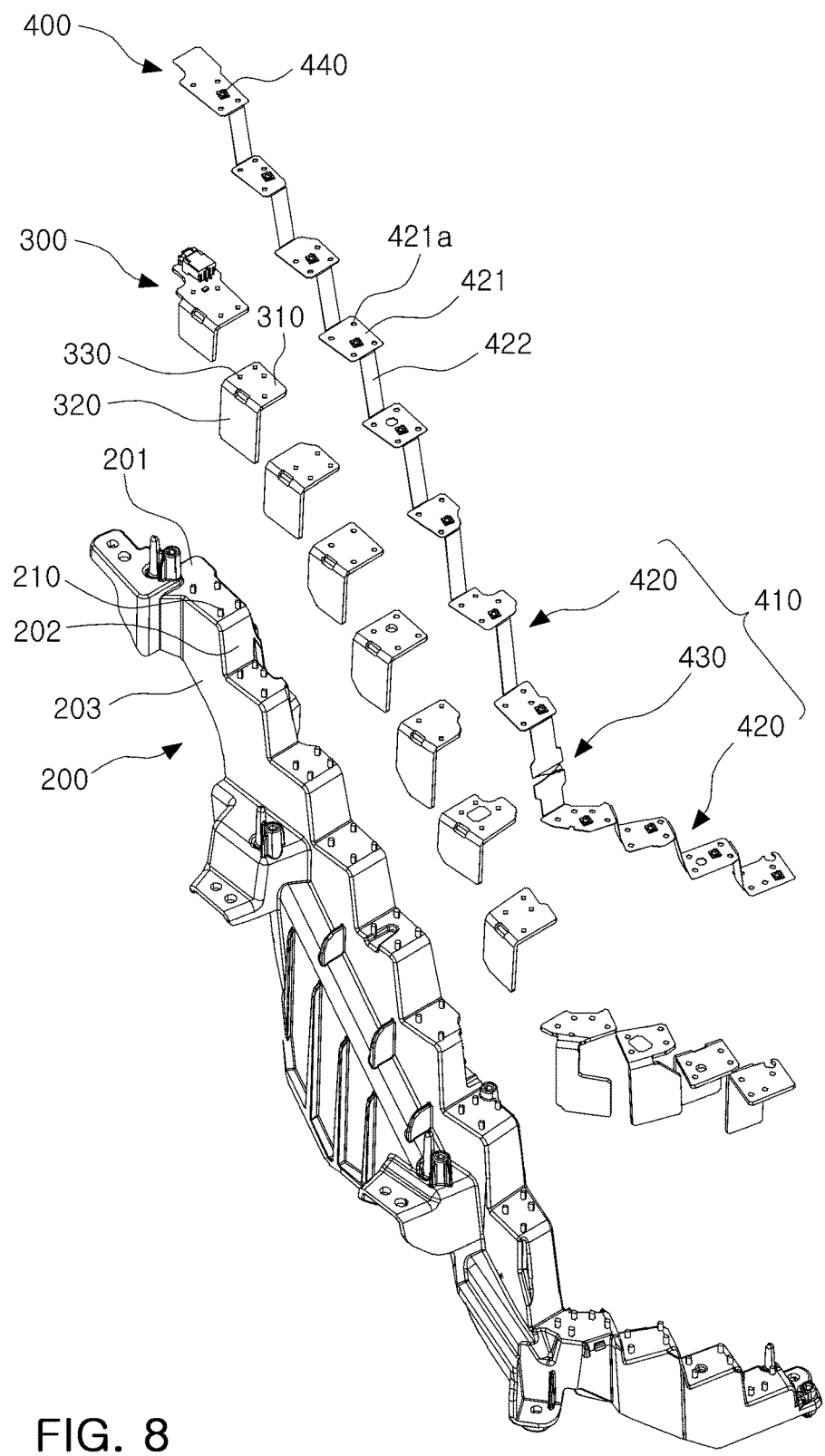
FIG. 8 is an exploded perspective view of FIG. 7.

Referring to FIGS. 7 and 8, a light source module 100 according to an exemplary embodiment may include a frame unit 200, a heat sink unit 300, and a light source unit 400.

The frame unit 200 may have a plurality of mounting surfaces 201 which may be arranged to be disposed on different positional levels. The frame unit 200 may have a stepped structure in which the plurality of mounting surfaces 201 are disposed on gradually higher positional levels to be arranged in a single direction.

As illustrated in FIG. 8, the frame unit 200 may include a plurality of mounting surfaces 201 serving as upper surfaces, connecting surfaces 202 connecting the plurality of mounting surfaces 201 to each other, and side surfaces 203.

The plurality of mounting surfaces 201 may be disposed on different positional levels, for example, disposed at different heights.

The mounting surface 201 may include a plurality of protrusions 210 protruded upwardly. The plurality of protrusions 210 may have a substantially cylindrical shape, and may be disposed with a predetermined distance therebetween.

The connecting surfaces 202 may be disposed between the plurality of mounting surfaces 201. The connecting surface 202 may connect two adjacent mounting surfaces 201 disposed on different positional levels to each other. For example, the connecting surface 202 may extend downwardly from one side of a mounting surface 201 located at a relatively high position to be connected to one side of another mounting surface 201 located at a relatively low position.

The frame unit 200 may be formed by injecting a resin, such as polycarbonate (PC) or polymethylmethacrylate (PMMA) into a mold and solidifying the resin. For example, the frame unit 200 may be formed using a method such as injection molding, transfer molding, compression molding, or the like.

The heat sink units 300 may be installed on the plurality of mounting surfaces 201, respectively. Each of the heat sink units 300 installed on the frame unit 200 may cover each of the mounting surfaces 201 of the frame unit 200 and side surfaces 203 of the frame unit 200 substantially perpendicular to each mounting surface 201.

The heat sink units 300 may be a type of heat sink detachably attached to the mounting surface 201, and may discharge heat generated by a light source unit 400 while supporting the light source unit 400 described later.

The heat sink unit 300 may include a base portion 310 located on each of the mounting surfaces 201 of the frame unit 200, and an extending portion 320 bent at an edge of the base portion 310 to extend downwardly along a side surface 203. The heat sink unit 300 may have, for example, an overall 'ㄱ' shape.

The base portion 310 and the extending portion 320 may be integrally formed by performing a press process on a single metal plate having a rectangular shape. In addition, due to the relatively simple structure, the heat sink unit 300 may be mass produced.

The base portion 310 may have a shape corresponding to the mounting surface 201. The base portion 310 may include a plurality of connection holes 330 into which the plurality of protrusions 210 protruded from the mounting surface 201 may be inserted.

The plurality of connection holes 330 may penetrate through the base portion 310. Positions of the plurality of connection holes 330 may correspond to positions in which the plurality of protrusions 210 are disposed on the mounting surface 201.

The light source unit 400 may include a board 410 disposed on the plurality of heat sink units 300, and a plurality of light emitting devices 440 mounted on the board 410.

The board 410 may include a plurality of body portions 420 and a connecting portion 430 integrally connecting the plurality of body portions 420. The board 410 may be substantially identical to the board 10 according to the exemplary embodiment with reference to FIGS. 1 to 6 in terms of a basic configuration and a structure thereof. Thus, a detailed description of the board 410 will be omitted.

In order for the board 410 to be disposed on the plurality of heat sink units 300 and to be installed on the frame unit 200, the board 410 may have a stepped structure in which the plurality of body portions 420 are continuously connected to each other through the connecting portion 430.

In detail, as illustrated in FIG. 8, the plurality of body portions 420 and the connecting portion 430 may have a structure in which they are disposed in a second position. For example, the plurality of body portions 420 may have a structure in which they are spread in a substantially linear form such as a '—' shape while forming a straight angle. Further, the connecting portion 430 may be folded to be maintained in a three dimensional structure in which the connecting portion 430 is protruded upwardly of flat surfaces of the plurality of body portions 420 (see FIGS. 3 and 4).

Each of the body portions 420 may include a plurality of mounting regions 421, each of which are disposed on the plurality of mounting surfaces 201, and on which the light emitting devices 440 are mounted, respectively, and extending regions 422 disposed between the plurality of mounting regions 421 to connect the mounting regions 421 to each other.

The plurality of mounting regions 421 may be disposed on the plurality of mounting surfaces 201, respectively, and may be disposed on the heat sink units 300 mounted on mounting surfaces 201 corresponding thereto, to be fixed onto the heat sink units 300, respectively. The plurality of mounting regions 421 may have through holes 421a through which the protrusions 210 protruded upwardly of the heat sink unit 300 are inserted.

The plurality of extending regions 422 may be disposed between the plurality of mounting regions 421 located on different positional levels, and may be connected to the mounting regions 421 to be substantially perpendicular thereto, respectively. For example, the plurality of extending regions 422 may extend from one sides of the mounting regions 421 located at relatively high positions downwardly to be connected to one sides of other mounting regions 421 located at relatively low positions, respectively.

The plurality of light emitting devices 440 may be mounted on the board 410 and may be disposed on the plurality of mounting surfaces 201, respectively.

The light emitting device 440 may be an optoelectronic device generating light having a predetermined wavelength by driving power applied from the external. For example, the light emitting device 440 may include a semiconductor light emitting diode (LED) chip including an n-type semiconductor layer, a p-type semiconductor layer, and an active layer interposed therebetween, or an LED package including the LED chip therein.

The light emitting device 440 may emit blue, green, or red light depending on a material contained therein or a combination of phosphors, and may also emit white light, ultraviolet light, or the like. The light emitting device 440 may be variously configured to generate light having the same wavelength or different wavelengths. Further, the light emitting devices 440 may be variously configured according to a level of power such as 0.5 W and 1 W.

As the light emitting devices 440, LED chips having various structures or various types of LED packages including the LED chips may be used. The exemplary embodiment illustrates the light emitting device 440 being an LED package, but is not limited thereto.

Figure 9A:
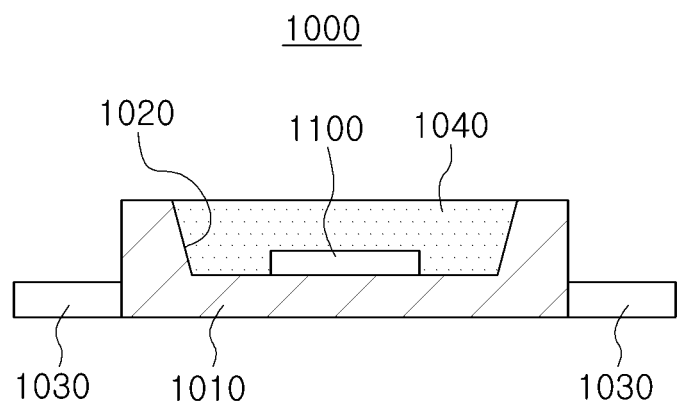
FIGS. 9A and 9B schematically illustrate light emitting devices employed in light source modules according to exemplary embodiments.
Figure 9B:
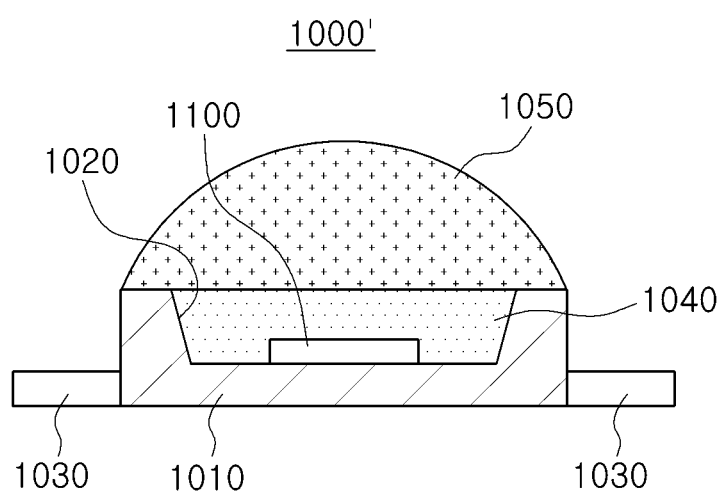

Hereinafter, a light emitting device employed in a light source module according to an exemplary embodiment will be described. FIGS. 9A and 9B schematically illustrate light emitting devices employable in a light source module according to exemplary embodiments.

As illustrated in FIG. 9A, a light emitting device 1000 according to an exemplary embodiment may have a package structure in which an LED chip 1100 is mounted in a body 1010 having a reflective cup 1020.

The body 1010 may support the LED chip 1100, and may be formed of a molding compound, such as a white molding compound, having relatively high light reflectivity. This may reflect light emitted from the LED chip 1100 to increase an amount of light emitted externally. Such a white molding compound may include a thermosetting resin-based material having high heat resistance or a silicon resin-based material. The white molding compound may also include a thermoplastic resin-based material to which a white pigment, a filling material, a hardener, a mold release agent, an antioxidant, an adhesion improver, and the like may be added. In addition, the white molding compound may include FR-4, CEM-3, an epoxy material, a ceramic material, or the like. Further, the white molding compound may include a metal, such as aluminum (Al).

The body 1010 may include a lead frame 1030 disposed on the board 410 to be electrically connected to an external power source. The lead frame 1030 may be formed of a material having excellent electrical conductivity, for example, a metal, such as aluminum, copper, or the like. If the body 1010 is formed of a metal, an insulation material may be interposed between the body 1010 and the lead frame 1030.

The reflective cup 1020 provided in the body 1010 may allow the lead frame 1030 to be exposed to a bottom surface of the reflective cup 1020 on which the LED chip 1100 is mounted. The LED chip 1100 may be electrically connected to the exposed lead frame 1030.

The size of a cross section of the reflective cup 1020 exposed to an upper surface of the body 1010 may be larger than that of a bottom surface of the reflective cup 1020. Here, the cross section of the reflective cup 1020 exposed to the upper surface of the body 1010 may define a light emission surface of the light emitting device 1000.

The LED chip 1100 may be encapsulated by an encapsulation portion 1040 formed in the reflective cup 1020 of the body 1010. The encapsulation portion 1040 may contain a wavelength conversion material.

FIG. 9B schematically illustrates a modification of a light emitting device 1000'. As illustrated in FIG. 9B, the body 1010 may further include a lens 1050 covering the encapsulation portion 1040.

The lens 1050 may have a hemispherical structure, for example, a convex lens. The lens 1050 may refract light generated by the LED chip 1100 to be radiated in a wide range.

A wavelength conversion material contained in the encapsulation portion 1040 may contain, for example, at least one or more type-phosphors emitting light having a different wavelength by being excited by light generated by the LED chip 1100. Thus, a control may be made such that light having various colors including white light may be emitted.

For example, when the LED chip 1100 emits blue light, white light may be emitted by combining yellow, green, red and/or orange phosphors. Further, at least one LED chip emitting violet light, blue light, green light, red light, or infrared light may be included. In this case, the LED chip 1100 may adjust a color rendering index (CRI) from about 40 to 100, and adjust a color temperature ranging from about 2,000 K to 20,000 K, to emit various types of white light. In addition, color may be adjusted to be appropriate for an ambient atmosphere or mood by generating violet, blue, green, red, orange visible ray light or infrared light as needed. Further, light having a special wavelength, capable of promoting growth of plant, may also be generated.

Figure 10:
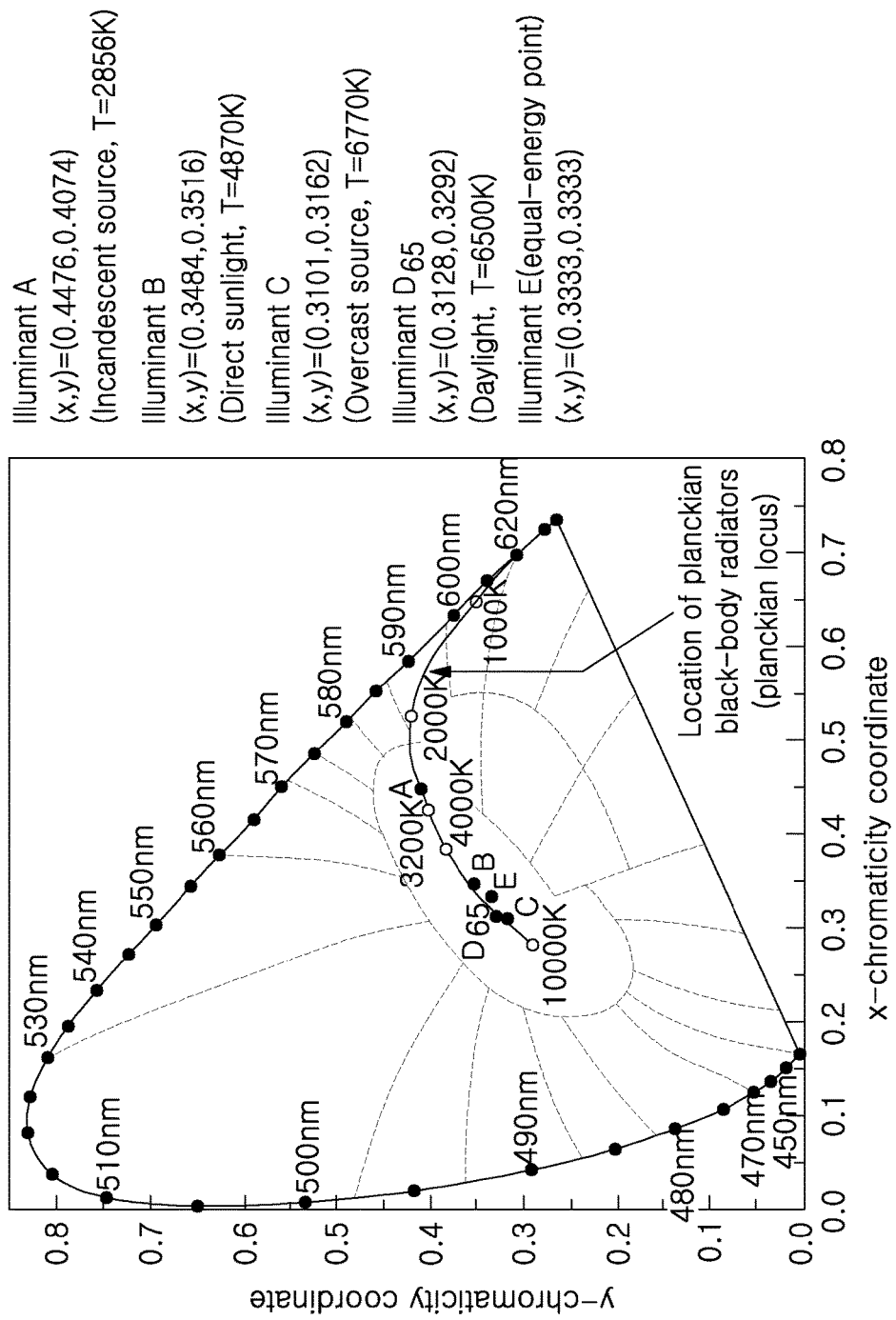
FIG. 10 is a CIE 1931 color space chromaticity diagram illustrating a wavelength conversion material employed according to an exemplary embodiment.

White light obtained by combining yellow, green, and red phosphors with a blue LED chip and/or a green LED chip with a red LED chip may have two or more peak wavelengths, and coordinates (x, y) of the CIE 1931 color space chromaticity diagram illustrated in FIG. 10 may be located on line segments (0.4476, 0.4074), (0.3484, 0.3516), (0.3101, 0.3162), (0.3128, 0.3292), and (0.3333, 0.3333) connected to one another. Alternatively, the coordinates (x, y) may be located in a region surrounded by the line segments and a blackbody radiation spectrum. A color temperature of white light may range from about 2,000 K to 20,000 K.

In FIG. 10, white light in the vicinity of a point E (0.3333, 0.3333) below the blackbody radiation spectrum may be in a state in which light of a yellow-based component becomes relatively weak. This white light may be used as an illumination light source of a region in which a relatively bright or refreshing mood may be provided to the naked eye. Thus, a lighting device product using white light in the vicinity of the point E (0.3333, 0.3333) below the blackbody radiation spectrum may be effective for use in retail spaces which sells groceries, clothing, or the like.

Phosphors may have the following formulae and colors:

Oxide-based Phosphor: yellow and green $Y_3Al_5O_{12}$:Ce, $Tb_3Al_5O_{12}$: Ce, and $Lu_3Al_5O_{12}$: Ce Silicate-based Phosphor: yellow and green $(Ba,Sr)_2SiO_4$:Eu, yellow and yellowish-orange $(Ba,Sr)_3SiO_5$:Ce Nitride-based Phosphor: Green β-SiAlON:Eu, yellow $La_3Si_6N_{11}$:Ce, orange α-SiAlON:Eu, red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ (0.5≤x≤3, 0<z<0.3, 0<y≤4) (where, Ln may be at least one kind of element selected from a group consisting of group IIIa elements and rare-earth elements, and M may be at least one kind of element selected from a group consisting of Ca, Ba, Sr, and Mg)

Fluoride-based Phosphor: KSF-based red $K_2SiF_6$:$Mn^{4+}$, $K_2TiF_6$:$Mn^{4+}$, $NaYF_4$:$Mn^{4+}$, $NaGdF_4$:$Mn^{4+}$, $K_3SiF_7$:$Mn^{4+}$ A composition of phosphor should basically coincide with stoichiometry, and respective elements may be substituted with other elements in respective groups of the periodic table of elements. For example, Sr may be substituted with Ba, Ca, Mg, or the like, of an alkaline earth group II, and Y may be substituted with lanthanum-based Tb, Lu, Sc, Gd, or the like. In addition, Eu or the like, an activator, may be substituted with Ce, Tb, Pr, Er, Yb, or the like, according to a required energy level. The activator may only be applied, or a sub-activator or the like may be applied to modify characteristics of the phosphor.

In detail, the fluoride-based red phosphors may be coated with a fluoride not containing Mn, or may further include an organic coating on a surface coated with a fluoride not containing Mn, in order to improve reliability at high temperatures and high humidity. In the case of the fluoride-based red phosphors as described above, because a narrow full width at half maximum (FWHM) less than or equal to 40 nm may be obtained, unlike other phosphors, the fluoride-based red phosphors may be used in high-resolution television such as ultra-high-definition televisions (UHD TVs).

In addition, the wavelength conversion material may be used as a phosphor substitute, and a material such as a quantum dot (QD) or the like may be used. For example, a phosphor may be mixed with a QD, or a QD alone may be used as the wavelength conversion material.

The quantum dot may have a core-shell structure using a III-V or II-VI compound semiconductor. For example, the quantum dot may include a core formed of CdSe, InP, or the like, and a shell formed of ZnS, ZnSe, or the like. Further, the quantum dot may include a ligand for stabilization of the core and the shell. For example, a diameter of the core may range from about 1 nm to 30 nm, in further detail, about 3 nm to 10 nm, and a thickness of the shell may range from about 0.1 nm to 20 nm, in further detail, about 0.5 nm to 2 nm.

The quantum dot may implement various colors depending on the size thereof. For example, when the quantum dot is used as a phosphor substitute, the quantum dot may be used as a red or green phosphor. In the case that the quantum dot is used, a narrow FWHM (e.g., about 35 nm) may be implemented.

Figure 11A:
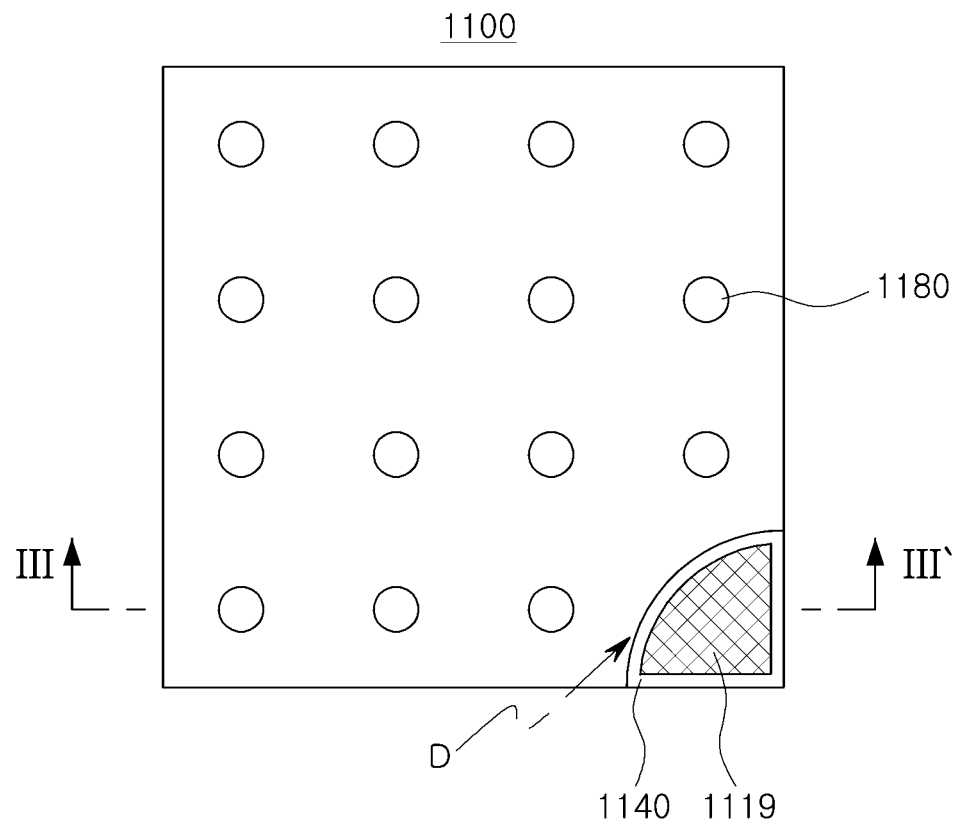
FIGS. 11A to 12 are a plan view and cross-sectional views illustrating various examples of an LED chip employed in a light emitting device.
Figure 11B:
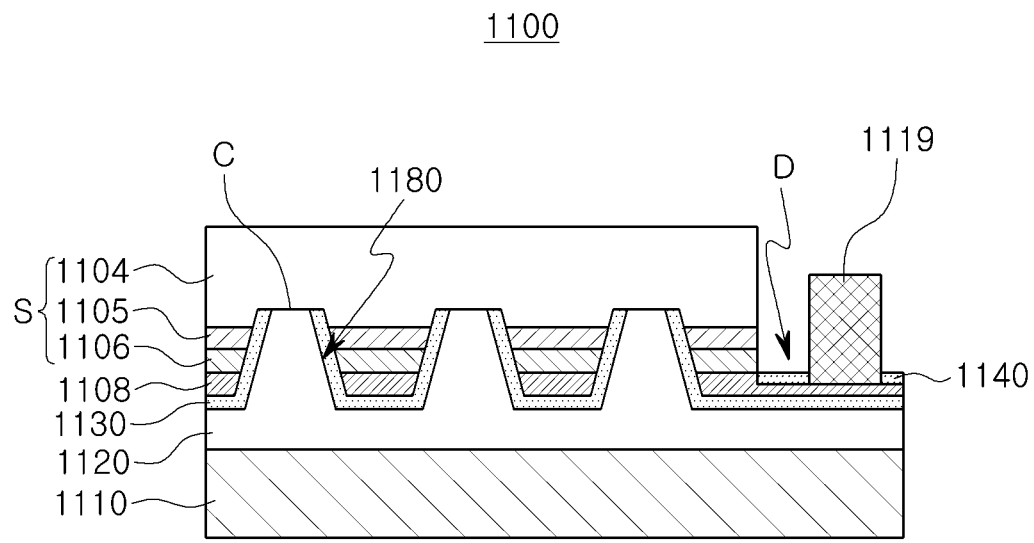

Hereinafter, LED chips according to various exemplary embodiments will be described. FIGS. 11A, 11B, and are a plan view and cross-sectional views illustrating various examples of an LED chip employed in a light emitting device.

FIG. 11A is a plan view of an LED chip according to an exemplary embodiment. FIG. 11B is a side cross-sectional view taken along line III-III' of FIG. 11A.

An LED chip 1100 illustrated in FIGS. 11A and 11B may have a large area structure for high output illumination. The LED chip 1100 may have a structure for an increase in current distribution efficiency and heat dissipation efficiency.

The LED chip 1100 may include a light emitting stack S, a first electrode 1120, an insulating layer 1130, a second electrode 1108, and a conductive substrate 1110. The light emitting stack S may include a first conductivity-type semiconductor layer 1104, an active layer 1105, and a second conductivity-type semiconductor layer 1106 stacked sequentially.

The first electrode 1120 may include one or more conductive vias 1180 electrically insulated from the second conductivity-type semiconductor layer 1106 and the active layer 1105 and extending to at least a portion of the first conductivity-type semiconductor layer 1104 to be electrically connected to the first conductivity-type semiconductor layer 1104. The conductive vias 1180 may be extended from an interface of the first electrode 1120 to an inside of the first conductivity-type semiconductor layer 1104 while penetrating through the second electrode 1108, the second conductivity-type semiconductor layer 1106, and the active layer 1105. The conductive vias 1180 may be formed through an etching process, for example, inductively coupled plasma reactive ion etching (ICP-RIE), or the like.

On the first electrode 1120, the insulating layer 1130 for electrically insulating regions except for the first conductivity-type semiconductor layer 1104 from the first electrode 1120 may be provided. As illustrated in FIG. 11B, the insulating layer 1130 may be formed on side surfaces of the conductive vias 1180 as well as in a space between the second electrode 1108 and the first electrode 1120. Thus, the second electrode 1108, the second conductivity-type semiconductor layer 1106, and the active layer 1105 exposed to the side surfaces of the conductive vias 1180 may be insulated from the first electrode 1120. The insulating layer 1130 may be formed by depositing an insulation material, such as $SiO_2$, $SiO_xN_y$, or $Si_xN_y$.

A contact region C of the first conductivity-type semiconductor layer 1104 may be exposed through the conductive vias 1180, and a portion of the first electrode 1120 may be in contact with the contact region C through the conductive vias 1180. Thus, the first electrode 1120 may be connected to the first conductivity-type semiconductor layer 1104.

The number, shape, or a pitch of the conductive vias 1180, or a contact diameter or a contact area thereof with the first and second conductivity-type semiconductor layers 1104 and 1106, and the like, may be appropriately designed, such that contact resistance may be reduced. The conductive vias 1180 may be arranged in rows and columns in various forms such that a current flow may be improved. The contact area and the number of the conductive vias 1180 may be adjusted such that the area of the contact region C may range from about 0.1% to 20% of a planar area of the light emitting stack S. For example, the area of the contact region C may range from 0.5% to 15% o, further from 1% to 10%. When the area of the contact region C is less than 0.1%, light emission characteristics may deteriorate due to non-uniform current distribution, and when the electrode area is increased greater than or 20%, light emission characteristics and brightness may be deteriorated due to a decrease in a light emission area.

A radius of the conductive vias 1180 contacting the first conductivity-type semiconductor layer 1104 may range from, for example, 1 μm to 50 μm, and the number of the conductive vias 1180 may be 1 to 48,000 for each light emitting stack S region, depending on an area of the light emitting stack S region. Although the number of the conductive vias 1180 is changed according to the area of the light emitting stack S region, the number of the conductive vias 1180 may be range, for example, from 2 to 45,000, further from 5 to 40,000, and further from 10 to 35,000. A distance between conductive vias 1180 may range from 10 μm to 1000 μm in a matrix structure having rows and columns, further from 50 μm to 700 μm, further from 100 μm to 500 μm, and further from 150 μm to 400 μm.

When a distance between the respective conductive vias 1180 is less than 10 μm, the number of vias may be increased, and a light emission area may be relatively reduced to degrade light emission efficiency. When a distance between the conductive vias 1180 is greater than 1,000 μm, a current diffusion may not be smoothly diffused, and thus light emission efficiency may be decreased. A depth of the conductive vias 1180 may be changed depending on thicknesses of the second conductivity-type semiconductor layer 1106 and the active layer 1105, and may range, for example, from 0.1 μm to 5.0 μm.

The second electrode 1108 may provide an electrode formation region D extending outwardly of the light emitting stack S to be exposed externally as illustrated in FIG. 11B. The electrode formation region D may include an electrode pad portion 1119 connecting the second electrode 1108 to an external power source. Although the electrode formation region D has been illustrated as being a single region, a plurality of electrode formation regions may be provided therein as needed. The electrode formation region D may be formed in one corner of the LED chip 1100 to maximize the light emission area as illustrated in FIG. 11A.

As in the illustrated exemplary embodiment, an etching stop insulating layer 1140 may be disposed around the electrode pad portion 1119. The etching stop insulating layer 1140 may be formed in the electrode formation region D after the light emitting stack S is formed and before the second electrode 1108 is formed, and may function as an etching stop portion in an etching process to form the electrode formation region D.

The second electrode 1108 may be formed using a material having a high reflectivity to make an ohmic contact with the second conductivity-type semiconductor layer 1106. As the material of the second electrode 1108, a reflective electrode material illustrated above may be used.

Figure 12:
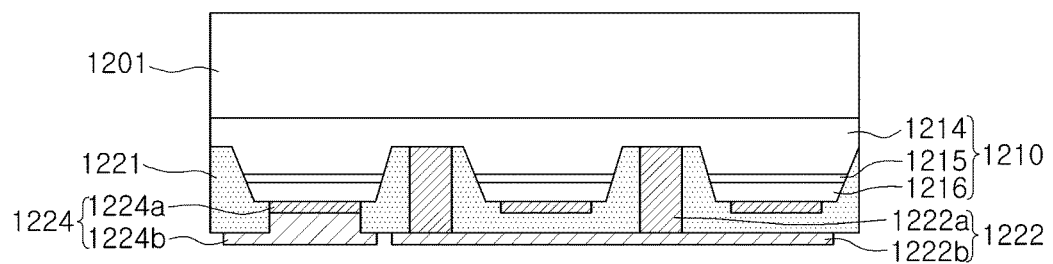

FIG. 12 is a side cross-sectional view illustrating an example of an LED chip used according to an exemplary embodiment.

Referring to FIG. 12, an LED chip 1200 may include a semiconductor stack 1210 formed on a board 1201. The semiconductor stack 1210 may include a first conductivity-type semiconductor layer 1214, an active layer 1215, and a second conductivity-type semiconductor layer 1216.

The LED chip 1200 may include first and second electrodes 1222 and 1224 connected to the first and second conductivity-type semiconductor layers 1214 and 1216, respectively. The first electrode 1222 may include connection electrode portions 1222a, such as conductive vias, penetrating through the second conductivity-type semiconductor layer 1216 and the active layer 1215 to be connected to the first conductivity-type semiconductor layer 1214, and a first electrode pad 1222b connected to the connection electrode portions 1222a. The connection electrode portions 1222a may be surrounded by an insulating portion 1221 to be electrically isolated from the active layer 1215 and the second conductivity-type semiconductor layer 1216. The connection electrode portions 1222a may be disposed in a region in which the semiconductor stack 1210 has been etched. The number, shape, or a pitch of the connection electrode portions 1222a, or a contact area thereof with the first conductivity-type semiconductor layer 1214, and the like, may be appropriately designed to reduce contact resistance. In addition, the connection electrode portions 1222a may be arranged to form rows and columns on the semiconductor stack 1210, thereby improving current flow. The second electrode 1224 may include an ohmic contact layer 1224a on the second conductivity-type semiconductor layer 1216 and a second electrode pad 1224b.

The connection electrode portions 1222a and the ohmic contact layers 1224a may respectively have a structure in which a conductive material having an ohmic characteristic with the first and second conductivity-type semiconductor layers 1214 and 1216 is formed in a single layer or a multilayer structure. For example, the connection electrode portions 1222a and the ohmic contact layers 1224a may be formed through a process of depositing or sputtering one or more of materials, such as Ag, Al, Ni, Cr, a transparent conductive oxide (TCO), and the like.

The first and second electrode pads 1222b and 1224b may be connected to the connection electrode portions 1222a and the ohmic contact layers 1224a, respectively, to function as external terminals of the LED chip 1200. For example, the first and second electrode pads 1222b and 1224b may be formed using Au, Ag, Al, Ti, W, Cu, Sn, Ni, Pt, Cr, NiSn, TiW, AuSn, or a eutectic metal thereof.

The first and second electrodes 1222 and 1224 may be disposed in a single direction and mounted on a lead frame, or the like, in the form of a so-called flip-chip.

In addition, the two electrodes 1222 and 1224 may be electrically isolated from each other by the insulating portion 1221. The insulating portion 1221 may be formed using any material having an electrical insulation characteristic, any object having electric insulation characteristic, and a material having a low light absorption rate. For example, a silicon oxide and a silicon nitride, such as $SiO_2$, $SiO_xN_y$, $Si_xN_y$, or the like may be used. A light reflective structure may be formed by distributing a light reflective filler in a light transmitting material as needed. In addition, the insulating portion 1221 may have a multilayer reflective structure in which a plurality of insulating films having different refractive indices are alternately stacked. For example, the multilayer reflective structure may be implemented by a distributed Bragg reflector (DBR) in which a first insulating film having a first refractive index and a second insulating film having a second refractive index are alternately stacked.

The multilayer reflective structure may be configured by repeatedly stacking the plurality of insulating films having different refractive indices 2 to 100 times. For example, the plurality of insulating films may be repeatedly stacked from 3 to 70 times, further from 4 to 50 times. The plurality of insulating films having the multilayer reflective structure may be respectively formed of an oxide or a nitride, such as $SiO_2$, SiN, $SiO_xN_y$, $TiO_2$, $Si_3N_4$, $Al_2O_3$, TiN, AlN, $ZrO_2$, TiAlN, TiSiN, or the like, or through a combination thereof. For example, when a wavelength of light generated by the active layer 1215 is indicated as λ, and n indicates a refractive index of a corresponding layer, the first and second insulating films may be formed to have a thickness of λ/4n, a thickness of about 300 Å to 900 Å. In this case, a refractive index and a thickness of the first and second insulating films may be selectively designed so that the multilayer reflective structure may have a high degree of reflectivity (95% or more) with respect to a wavelength of light generated by the active layer 1215.

The refractive indices of the first and second insulating films may be determined in a range of about 1.4 to 2.5, and may be lower than refractive indices of the first conductivity-type semiconductor layer 1214 and the board, but may be greater than a refractive index of the board while being lower than the refractive index of the first conductivity-type semiconductor layer 1214.

Figure 13:
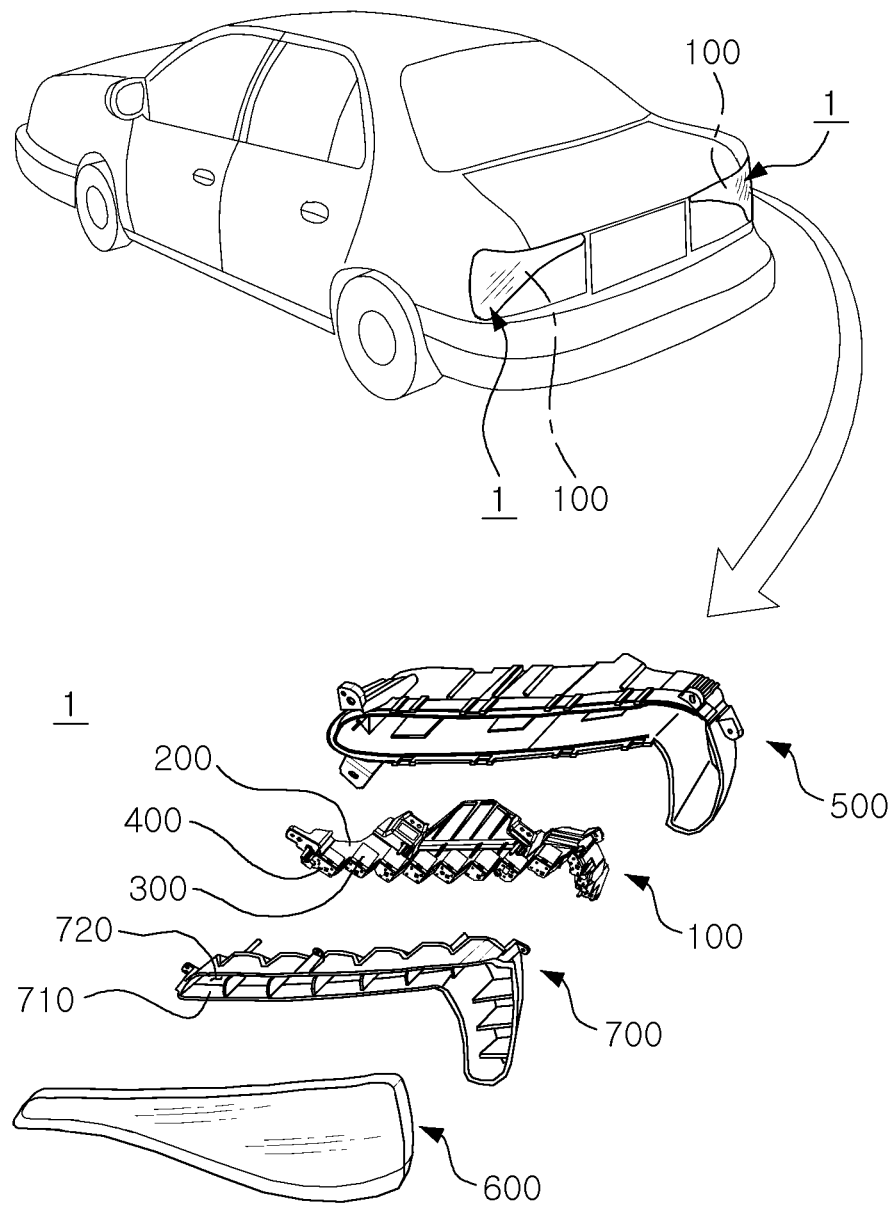
FIG. 13 is a schematic perspective view of a lighting apparatus according to an exemplary embodiment.

FIG. 13 is a schematic view illustrating a lighting apparatus in which a light source module according to various exemplary embodiments is employed. The lighting apparatus according to the exemplary embodiment may include, for example, rear lamps of a vehicle.

As illustrated in FIG. 13, a lighting apparatus 1 may include a housing 500 supporting a light source module 100, a cover 600 covering the housing 500 to protect the light source module 100, and a reflector 700 disposed above the light source module 100. The reflector 700 may include a plurality of reflective surfaces 710 and a plurality of through holes 720 formed in each of bottom surfaces of the plurality of reflective surfaces 710. Light source unit 400 of the light source module 100 may include light emitting device 440 (see FIG. 8) exposed to the plurality of reflective surfaces 710 via the plurality of through holes 720.

The lighting apparatus 1 may have an overall gentle curved surface structure to correspond to a shape of a corner portion of a vehicle. Thus, the frame unit 200, the plurality of heat sink units 300, and the light source unit 400 combined therewith, may form the light source module 100 having a stepped structure corresponding to the curved surface structure of the lighting apparatus 1. A structure of the light source module 100 as described above may be variously changed depending on a design of the lighting apparatus 1, such as the rear lamps.

Figure 14:
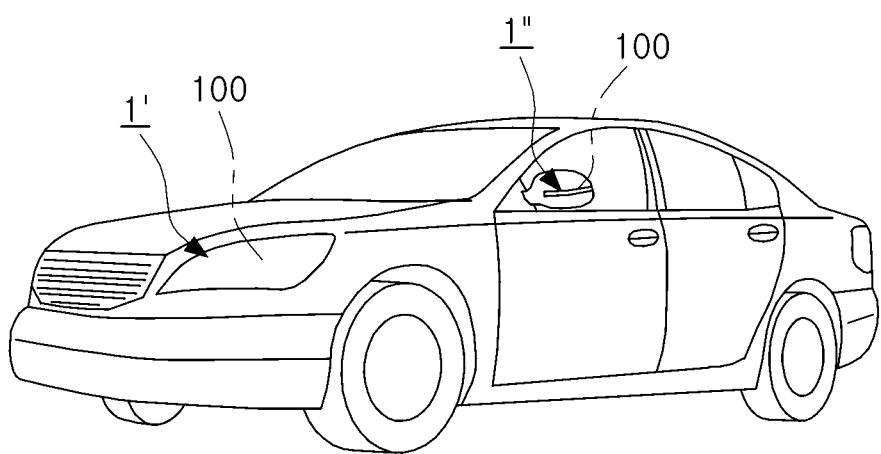
FIG. 14 is a schematic perspective view illustrating another example embodiment of the lighting apparatus of FIG. 13.

The illustrated exemplary embodiment relates to a case that the lighting apparatus 1 is the rear lamps of the vehicle a, but is not limited thereto. For example, as illustrated in FIG. 14, a lighting apparatus 1' may include headlamps of a vehicle, and the light source module 100 may include a multi-stage stepped structure corresponding to a curved surface shape of the headlamps.

In addition, a lighting apparatus 1" may include an indicator light mounted in a door mirror of the vehicle. The light source module 100 may be easily combined to have a shape corresponding to a curved surface shape of the indicator light.

As set forth above, according to exemplary embodiments, a board in which SMT may be performed once without dividing the board into parts even when a length of the board is relatively long, and a light source module including the same may be provided.

While exemplary embodiments have been shown and described above, it will be apparent to those skilled in the art that modifications and variations could be made without departing from the scope of the inventive concept as defined by the appended claims.

What is claimed is:

1. A board comprising:
   a plurality of body portions; and
   a connecting portion disposed between the plurality of body portions to integrally connect the plurality of body portions,
   wherein a shape of the connecting portion is changed between a flat shape and a protruding shape, when positions of the plurality of body portions are changed by rotating the plurality of body portions based on the connecting portion,
   wherein the connecting portion comprises an inner surface and an outer surface connecting two end surfaces of the plurality of body portions opposing each other, and has an asymmetrical structure in which the inner surface and the outer surface have different lengths.

2. The board of claim 1, wherein a length of the inner surface is shorter than a length of the outer surface.

3. The board of claim 1, wherein the inner surface and the outer surface respectively have a curved surface and are curved in the same direction.

4. The board of claim 1, wherein the outer surface includes a concave groove concavely recessed toward the inner surface.

5. The board of claim 1, wherein the plurality of body portions include a first position in which the connecting portion is spread to be maintained in a flat plane structure and a second position in which the connecting portion is folded to be maintained in a three-dimensional structure protruded upwardly of flat surfaces of the plurality of body portions.

6. The board of claim 5, wherein the plurality of body portions are disposed to form an angle based on the connecting portion, in the first position.

7. The board of claim 5, wherein the connecting portion has a structure in which the connecting portion is folded in half to allow two sides of the outer surface to approximate each other based on a virtual central line passing through a center of the outer surface and the inner surface, in the second position.

8. The board of claim 5, wherein the inner surface is disposed on the same positional level as a position of the plurality of body portions, and the outer surface is disposed on a positional level different from a position of the inner surface to be protruded upwardly of surfaces of the plurality of body portions, in the second position.

9. The board of claim 5, wherein the connecting portion includes a structure inclined from the outer surface disposed in a higher position toward the inner surface and the plurality of body portions disposed in a lower position, in the second position.

10. The board of claim 1, wherein each of the body portions comprises a plurality of mounting regions on which light emitting devices are respectively mounted, and extending regions respectively disposed between the plurality of mounting regions to connect the mounting regions.

11. A light source module comprising:
    a frame comprising a plurality of mounting surfaces arranged at different positional levels;
    a plurality of heat sinks respectively connected to the plurality of mounting surfaces; and
    a light source comprising a board respectively disposed on the plurality of heat sinks, and a plurality of light emitting devices respectively mounted on the board respectively disposed on the plurality of mounting surfaces, wherein the board comprises a plurality of body portions and a connecting portion disposed between the plurality of body portions to integrally connect the plurality of body portions, and wherein a shape of the connecting portion is changed between a flat shape and a protruding shape, when positions of the plurality of body portions are changed by rotating the plurality of body portions based on the connecting portion.

12. The light source module of claim 11, wherein the frame further comprises a plurality of protrusions protruded from the mounting surface, and the board comprises a plurality of connection holes into which the plurality of protrusions are inserted.

13. The light source module of claim 11, wherein the plurality of body portions respectively comprise a plurality of mounting regions respectively disposed on the plurality of mounting surfaces and on which the light emitting devices are respectively mounted, and extending regions respectively disposed between the plurality of mounting regions to connect the mounting regions.

14. The light source module of claim 11, wherein the frame comprises a stepped structure defining the different positional levels of the plurality of mounting surfaces rise in an arrangement direction.

15. The light source module of claim 14, wherein the frame further comprises a plurality of connecting surfaces vertically connecting the plurality of mounting surfaces to each other.

16. The light source module of claim 11, wherein each of the heat sinks comprises a base portion respectively disposed on each of the plurality of mounting surfaces, and an extending portion extending from an edge of the base portion to be bent to be substantially perpendicular to the base portion.

17. A lighting apparatus comprising:
a light source module;
a housing supporting the light source module; and
a cover covering the housing to cover the light source module,
wherein the light source module comprises:
a frame comprising a plurality of mounting surfaces arranged at different levels;
a plurality of heat sinks respectively connected to the plurality of mounting surfaces;
a board comprising a plurality of body portions and a connecting portion disposed between the plurality of body portions to integrally connect the plurality of body portions and respectively disposed on the plurality of heat sinks; and
a plurality of light emitting devices respectively mounted on the board respectively disposed on the plurality of mounting surfaces,
wherein a shape of the connecting portion is changed between a flat shape and a protruding shape, when positions of the plurality of body portions are changed by rotating the plurality of body portions based on the connecting portion.

18. The lighting apparatus of claim 17, further comprising a reflector configured to reflect light of the light source module.

19. The lighting apparatus of claim 18, wherein the reflector comprises a plurality of reflective surfaces and a plurality of through holes respectively formed on a bottom surface of each of the plurality of reflective surfaces, and the plurality of light emitting devices are respectively exposed to the plurality of reflective surfaces through the through holes.

* * * * *